United States Patent
Bader et al.

(10) Patent No.: US 7,691,659 B2
(45) Date of Patent: Apr. 6, 2010

(54) RADIATION-EMITTING SEMICONDUCTOR ELEMENT AND METHOD FOR PRODUCING THE SAME

(75) Inventors: Stefan Bader, Eilsbrunn (DE); Berthold Hahn, Hemau (DE); Volker Härle, Laaber (DE); Hans-Jürgen Lugauer, Sinzing (DE); Manfred Mundbrod-Vangerow, Oxenbronn (DE); Dominik Eisert, Regensburg (DE)

(73) Assignee: Osram GmbH, Munich (DE)

( * ) Notice: Subject to any disclaimer, the term of this patent is extended or adjusted under 35 U.S.C. 154(b) by 9 days.

(21) Appl. No.: 11/067,349

(22) Filed: Feb. 25, 2005

(65) Prior Publication Data

US 2005/0282373 A1 Dec. 22, 2005

Related U.S. Application Data

(63) Continuation of application No. 10/239,106, filed as application No. PCT/DE01/01002 on Mar. 16, 2001, now Pat. No. 6,878,563.

(30) Foreign Application Priority Data

Apr. 26, 2000 (DE) ................ 100 20 464
May 26, 2000 (DE) ................ 100 26 255
Oct. 17, 2000 (DE) ................ 100 51 465

(51) Int. Cl.
*H01L 21/00* (2006.01)
(52) U.S. Cl. ............... 438/47; 438/46; 438/33; 438/455; 438/458; 438/604; 257/E21.088
(58) Field of Classification Search .......... 438/46, 438/47, 455–459, 22, 33, 604; 257/99, E21.088
See application file for complete search history.

(56) References Cited

U.S. PATENT DOCUMENTS 4,170,018 A 10/1979 Runge (Continued)

FOREIGN PATENT DOCUMENTS

CN 1166890 12/1997

(Continued)

OTHER PUBLICATIONS

Mensz, P.M. et al. "$In_xGa_{1-x}N/Al_yGa_{1-y}N$ Violet Light Emitting Diodes with Reflective P-contacts for High Single Sided Light Extarction", *Electronics Leters*, vol. 33, No. 24, pp. 2066-2068; 1997.

(Continued)

*Primary Examiner*—Davienne Monbleau
*Assistant Examiner*—Matthew Reames
(74) *Attorney, Agent, or Firm*—Fish & Richardson P.C.

(57) ABSTRACT

This invention describes a radiation-emitting semiconductor component based on GaN, whose semiconductor body is made up of a stack of different GaN semiconductor layers (1). The semiconductor body has a first principal surface (3) and a second principal surface (4), with the radiation produced being emitted through the first principal surface (3) and with a reflector (6) being produced on the second principal surface (4).

The invention also describes a production method for a semiconductor component pursuant to the invention. An interlayer (9) is first applied to a substrate (8), and a plurality of GaN layers (1) that constitute the semiconductor body of the component are then applied to this. The substrate (8) and the interlayer (9) are then detached and a reflector (6) is produced on a principal surface of the semiconductor body.

29 Claims, 7 Drawing Sheets

U.S. PATENT DOCUMENTS

| | | | |
|---|---|---|---|
| 4,232,440 A | 11/1980 | Bastek | |
| 4,243,996 A | 1/1981 | Lebailly et al. | |
| 4,448,636 A | 5/1984 | Baber | |
| 4,983,538 A | 1/1991 | Gotou | |
| 5,040,044 A | 8/1991 | Noguchi et al. | 357/52 |
| 5,157,468 A | 10/1992 | Matsumoto | |
| 5,210,051 A | 5/1993 | Carter, Jr. | |
| 5,362,667 A | 11/1994 | Linn et al. | |
| 5,373,184 A | 12/1994 | Moslehi | |
| 5,374,564 A | 12/1994 | Bruel | |
| 5,376,580 A | 12/1994 | Kish et al. | |
| 5,385,632 A | 1/1995 | Goossen | |
| 5,429,954 A | 7/1995 | Gerner | |
| 5,523,589 A | 6/1996 | Edmond et al. | |
| 5,578,839 A * | 11/1996 | Nakamura et al. | 257/96 |
| 5,625,202 A | 4/1997 | Chai | |
| 5,661,074 A | 8/1997 | Tischler | |
| 5,701,321 A | 12/1997 | Hayafuji et al. | |
| 5,728,623 A | 3/1998 | Mori | |
| 5,739,554 A | 4/1998 | Edmond et al. | |
| 5,753,134 A | 5/1998 | Biebl | |
| 5,780,873 A | 7/1998 | Itaya et al. | |
| 5,786,606 A * | 7/1998 | Nishio et al. | 257/103 |
| 5,851,905 A | 12/1998 | McIntosh et al. | |
| 5,862,167 A | 1/1999 | Sassa et al. | |
| 5,866,468 A | 2/1999 | Kono et al. | |
| 5,874,747 A | 2/1999 | Redwing et al. | |
| 5,877,070 A | 3/1999 | Goesele et al. | |
| 5,880,491 A | 3/1999 | Soref et al. | |
| 5,889,295 A * | 3/1999 | Rennie et al. | 257/96 |
| 5,917,202 A | 6/1999 | Haitz et al. | |
| 5,928,421 A | 7/1999 | Yuri et al. | |
| 5,985,687 A | 11/1999 | Bowers et al. | |
| 6,046,464 A | 4/2000 | Schetzina | |
| 6,060,335 A | 5/2000 | Rennie et al. | |
| 6,060,730 A | 5/2000 | Tsutsui | |
| 6,100,044 A | 8/2000 | Evans et al. | |
| 6,100,104 A | 8/2000 | Haerle | 438/33 |
| 6,111,272 A | 8/2000 | Heinen | |
| 6,133,589 A | 10/2000 | Krames et al. | |
| 6,150,230 A | 11/2000 | Kotecki et al. | |
| 6,222,207 B1 | 4/2001 | Carter-Coman et al. | |
| 6,258,618 B1 | 7/2001 | Lester | |
| 6,291,839 B1 | 9/2001 | Lester | |
| 6,303,405 B1 | 10/2001 | Yoshida et al. | |
| 6,328,796 B1 | 12/2001 | Kub et al. | |
| 6,335,212 B1 | 1/2002 | Uemura et al. | |
| 6,347,101 B1 | 2/2002 | Wu et al. | |
| 6,355,497 B1 * | 3/2002 | Romano et al. | 438/39 |
| 6,365,427 B1 | 4/2002 | Gauggel et al. | |
| 6,380,564 B1 | 4/2002 | Chen et al. | |
| 6,420,199 B1 * | 7/2002 | Coman et al. | 438/22 |
| 6,420,242 B1 | 7/2002 | Cheung et al. | |
| 6,448,102 B1 | 9/2002 | Kneissl et al. | |
| 6,468,824 B2 | 10/2002 | Chen et al. | |
| 6,495,862 B1 | 12/2002 | Okazaki et al. | |
| 6,518,079 B2 | 2/2003 | Imler | |
| 6,559,075 B1 | 5/2003 | Kelly et al. | |
| 6,562,701 B2 | 5/2003 | Ishida et al. | |
| 6,607,931 B2 | 8/2003 | Streubel | |
| 6,617,182 B2 | 9/2003 | Ishida et al. | |
| 6,617,261 B2 | 9/2003 | Wong et al. | |
| 6,620,643 B1 | 9/2003 | Koike | |
| 6,677,173 B2 | 1/2004 | Ota | |
| 6,849,878 B2 | 2/2005 | Bader et al. | |
| 6,869,820 B2 | 3/2005 | Chen | |
| 6,878,563 B2 | 4/2005 | Bader et al. | |
| 6,924,163 B2 | 8/2005 | Okazaki et al. | |
| 6,936,859 B1 | 8/2005 | Uemura et al. | |
| 6,946,312 B2 | 9/2005 | Kon et al. | |
| 6,975,444 B2 | 12/2005 | Huibers | |
| 7,319,247 B2 | 1/2008 | Bader et al. | |
| 2001/0035580 A1 * | 11/2001 | Kawai | 257/745 |
| 2001/0042866 A1 | 11/2001 | Coman et al. | |
| 2002/0096102 A1 | 7/2002 | Sloot | |
| 2003/0086856 A1 | 5/2003 | D'Evelyn et al. | |
| 2003/0131788 A1 | 7/2003 | Ueda | |
| 2003/0168664 A1 | 9/2003 | Hahn et al. | |
| 2003/0197170 A1 | 10/2003 | Bader et al. | |
| 2004/0026709 A1 | 2/2004 | Bader et al. | |
| 2004/0033638 A1 | 2/2004 | Bader et al. | |
| 2004/0104395 A1 * | 6/2004 | Hagimoto et al. | 257/79 |
| 2004/0222434 A1 | 11/2004 | Uemura et al. | |
| 2005/0179051 A1 | 8/2005 | Kondoh et al. | |
| 2005/0282373 A1 | 12/2005 | Bader et al. | |
| 2006/0011925 A1 | 1/2006 | Bader et al. | |
| 2007/0012944 A1 | 1/2007 | Bader et al. | |
| 2007/0221936 A1 | 9/2007 | Hahn et al. | |

FOREIGN PATENT DOCUMENTS

| | | |
|---|---|---|
| CN | 1218997 | 6/1999 |
| DE | 2915888 | 10/1979 |
| DE | 3508469 A | 9/1986 |
| DE | 40 38216 | 7/1991 |
| DE | 43 05296 | 8/1994 |
| DE | 690 08931 | 12/1994 |
| DE | 19753492 | 9/1998 |
| DE | 19830838 | 1/1999 |
| DE | 19741442 | 4/1999 |
| DE | 19921987 | 11/1999 |
| DE | 19838810 | 3/2000 |
| DE | 10000088 | 8/2000 |
| EP | 0051172 | 5/1982 |
| EP | 0282075 | 9/1988 |
| EP | 0317445 | 5/1989 |
| EP | 0 356 037 | 2/1990 |
| EP | 0 404 565 | 12/1990 |
| EP | 0 740 376 | 10/1996 |
| EP | 0 810 674 | 12/1997 |
| EP | 0817283 | 1/1998 |
| EP | 0 871 228 | 10/1998 |
| EP | 0 896 405 | 2/1999 |
| EP | 0 905 797 | 3/1999 |
| GB | 2322737 | 2/1998 |
| GB | 2346478 | 8/2000 |
| JP | 10-42813 | 2/1989 |
| JP | 01-135070 | 5/1989 |
| JP | 04-132274 | 5/1992 |
| JP | 004223330 | 8/1992 |
| JP | 06-045651 | 2/1994 |
| JP | 06-224404 | 8/1994 |
| JP | 07-142815 | 6/1995 |
| JP | 07221347 | 8/1995 |
| JP | 08032116 | 2/1996 |
| JP | 080322116 | 2/1996 |
| JP | 08064910 | 3/1996 |
| JP | 08116090 | 5/1996 |
| JP | 8-307001 | 11/1996 |
| JP | 9-129927 | 5/1997 |
| JP | 09-129984 | 5/1997 |
| JP | 09-223819 | 8/1997 |
| JP | 10-12921 | 1/1998 |
| JP | 10-114600 | 5/1998 |
| JP | 10150220 | 6/1998 |
| JP | 10-223496 | 8/1998 |
| JP | 10209494 | 8/1998 |
| JP | 63224213 | 9/1998 |
| JP | 10-290027 | 10/1998 |
| JP | 10-341036 | 12/1998 |
| JP | 10/341036 | 12/1998 |
| JP | 11-031842 | 2/1999 |
| JP | 11-074558 | 3/1999 |
| JP | 11068157 | 3/1999 |

| | | |
|---|---|---|
| JP | 11074558 | 3/1999 |
| JP | 110744558 | 3/1999 |
| JP | 11-504764 | 4/1999 |
| JP | 11-145515 | 5/1999 |
| JP | 11-154648 | 6/1999 |
| JP | 11150297 | 6/1999 |
| JP | 11191641 | 7/1999 |
| JP | 11-220168 | 8/1999 |
| JP | 11-220171 | 8/1999 |
| JP | 11/251634 | 9/1999 |
| JP | 11-284228 | 10/1999 |
| JP | 03-024771 | 1/2000 |
| JP | 2000-77713 A | 3/2000 |
| JP | 2000-101139 | 4/2000 |
| JP | 2000-114599 | 4/2000 |
| TW | 369731 | 9/1999 |
| TW | 441859 | 4/2000 |
| WO | WO 92/13363 | 8/1992 |
| WO | WO 95/00974 | 1/1995 |
| WO | WO 97/48138 | 12/1997 |
| WO | WO 9814986 | 4/1998 |
| WO | WO 00/19499 | 4/2000 |
| WO | WO 00/34989 | 6/2000 |
| WO | WO 01/41223 | 6/2001 |
| WO | WO 01/47038 | 6/2001 |
| WO | WO 01/47039 | 6/2001 |

OTHER PUBLICATIONS

Schnitzer, I. et al.:"30% external quantum efficiency from surface textured, thin-film light-emitting diodes", Appl. Phys. Lett. 63 (16), Oct. 1993, S. 2174.

Lee, J.L. et al., "Ohmic contact formation mechanism of nonalloyed Pd contacts to p-type GaN observed by positron annihilation spectroscopy", Appl. Phys. Lett., 74(16), ISSN 0003-6951, 1999, S.2289-2291.

Margalith, T. et al., "Indium tin oxide contacts to gallium nitride optoelectronic devices", Appl. Phys. Lett., 74(26), ISSN 0003-6951, 1999, S.3930-3932.

P.M. Mensz et al., "$In_xGa_{1-x}N/Al_yGa_{1-y}N$ violet light emitting diodes with reflective p-contacts for high single sided light extraction", Electronics Letters, vol. 33, No. 24, pp. 2066-2068 (Nov. 20, 1997.

Schnitzer, I. et al.:"30% external quantum efficiency from surface textured, thin-film light-emitting diodes", Appl. Phys. Lett., vol. 63 (16), pp. 2174-2176; Oct. 1993.

Steckl, A.J. et al., "Growth and Characterization of GaN Thin Films on SiC Sol Substrates", Journal of Electronic Materials, vol. 26, No. 3, 1997, pp. 217-223.

von Ardenne, M., "Tabellen zur angewandten Physik", III. Band, VEB Deutscher Verlag der Wissenschaften, Berlin, 1973, pp. 168-169.

Wong, W.S. et al., "Fabrication of thin-film InGaN light-emitting diode membranes by laser lift-off", Appl. Phys. Letter, vol. 75, No. 10, 1999, pp. 1360-1362.

Kelly M.K. et al., "Optical patterning of GaN films", Applied Physics Letters, vol. 69(12):1749-51 (1996).

Office Action in U.S. Appl. No. 11/508,504 dated Aug. 11, 2008.

Office Action in U.S. Appl. No. 11/755,284 dated Nov. 26, 2008.

Non-Final Office Action dated Feb. 23, 2009, U.S. Appl. No. 10/417,611.

U.S. Appl. No. 10/239,106, filed Jan. 7, 2003, Donghee Kang.

U.S. Appl. No. 11/065,769, filed Feb. 25, 2005, Long Pham, Pending.

U.S. Appl. No. 10/258,340, filed Jun. 10, 2006, Long K. Tran, Pending.

U.S. Appl. No. 11/508,504, filed Aug. 23, 2006, Pending.

U.S. Appl. No. 10/296,596, filed Jan. 16, 2003, Jerome Jackson, Jr.

* cited by examiner e)

f)

g)

a)

b)

c)

d)

a)

b)

c)

RADIATION-EMITTING SEMICONDUCTOR ELEMENT AND METHOD FOR PRODUCING THE SAME

CROSS REFERENCE TO RELATED APPLICATIONS

Pursuant to 35 U.S.C. § 120, this application is a continuation application of U.S. application Ser. No. 10/239,106, filed on Jan. 7, 2003 now U.S. Pat. No. 6,878,563, which is the U.S. National Phase application of WIPO Application No. PCT/DE01/01002, filed on Mar. 16, 2001, which claims the benefit of foreign priority applications filed in Germany, Serial Nos. 10020464.3, filed on Apr. 26, 2000, 10026255.4, filed on May 26, 2000, and 10051465.0, filed on Oct. 17, 2000. The contents of the prior applications are incorporated herein by reference in their entirety.

FIELD OF THE INVENTION

This invention relates to a radiation-emitting semiconductor component and a method for producing it.

BACKGROUND OF THE INVENTION

Radiation-emitting semiconductor components based on GaN are disclosed, for example, by U.S. Pat. No. 5,210,051. Such semiconductor components contain a semiconductor body with an active GaN layer that is applied to an SiC substrate. The semiconductor body is contacted on the front on the light-emitting GaN layer and on the back on the SiC substrate.

It is also disclosed by U.S. Pat. No. 5,874,747, for example, how to use related nitrides and ternary or quaternary mixed crystals based on them instead of GaN. Included among them in particular are the compounds AlN, InN, AlGaN, InGaN, InAlN, and AlInGaN.

The term "III-V nitride semiconductor" as used below refers to these ternary and quaternary mixed crystals as well as to gallium nitride itself.

It is also known how to produce GaN semiconductor crystals by epitaxy. A sapphire crystal or SiC is ordinarily used as substrate. According to U.S. Pat. No. 5,928,421, an SiC substrate is preferred with regard to avoiding lattice defects, since GaN layers grown on sapphire have a large number of lattice defects because of the relatively large lattice mismatch between sapphire and GaN.

One drawback of radiation-emitting GaN semiconductor components consists of the fact that at the surface at which the radiation produced in the semiconductor body is emitted, a large refractive index discontinuity occurs at the transition from semiconductor body to the surroundings. A large refractive index discontinuity leads to a considerable fraction of the radiation being reflected back into the semiconductor body and to the radiation yield of the component thereby being reduced.

One cause of this is the total reflection of the radiation produced at the emission surface. Light rays are completely reflected back into the semiconductor body if the angle of incidence of the light rays at the emission surface is greater than the angle of total reflection, each based on the normal to the surface. As the difference between the refractive index of the semiconductor body and that of the surroundings increases, the angle of total reflection decreases and the fraction of totally reflected radiation rises.

Light rays whose angle of incidence is smaller than the angle of total reflection are also partially reflected back into the semiconductor body, with the back-reflected fraction becoming larger as the difference between the refractive indices of the semiconductor body and of the surroundings increases. A large refractive index discontinuity, such as that occurring with GaN components, therefore leads to large reflection losses at the emission surface. The back-reflected radiation is partially absorbed in the semiconductor body or escapes at surfaces other than the emission surface, so that the overall radiation yield is reduced.

One means of increasing the radiation yield consists of applying a reflector to the substrate of the semiconductor body. This is shown, for example, in DE 43 05 296. This again points the radiation back-reflected into the semiconductor body in the direction of the emission surface, so that the back-reflected portion of the radiation is not lost but is at least partially likewise emitted after one or more internal reflections.

In the case of radiation-emitting GaN components pursuant to the state of the art, it is a drawback in this, regard to use an absorbing substrate such as SiC, for example. The radiation reflected back into the semiconductor body is absorbed in large part by the substrate, so that it is impossible to increase the radiation yield by means of a reflector.

U.S. Pat. No. 5,786,606 discloses a method for producing radiation-emitting semiconductor components based on GaN in which an SiC layer is first grown by epitaxy on a SIMOX substrate (Separation by IMplantation of OXygen) on an SOI substrate (Silicon On Isolator). A plurality of GaN-based layers are then deposited on the SiC layer.

However, the radiation yield of the component is reduced by the SiC layer, since a portion of the radiation produced is absorbed in the SiC layer. Also, the epitaxial formation of an SiC layer with adequate crystal quality requires a high production cost.

The task underlying this invention is to provide a III-V nitride semiconductor component with increased light yield. It is also the purpose of this invention to develop a method for producing such semiconductor components.

This task is accomplished by a semiconductor component and a production method disclosed herein.

Beneficial refinements of the invention are the objects of various embodiments disclosed herein, including beneficial forms of embodiment of the production process.

BRIEF SUMMARY OF THE INVENTION

The invention provides that the radiation-emitting semiconductor component is developed as a thin-layer component that in particular has no radiation-absorbing substrate. The semiconductor body of the component is made up of a stacked plurality of different III-V nitride semiconductor layers. In operation, an active semiconductor layer based on GaN or on a related nitride produces electromagnetic radiation that is emitted through a first principal surface of the stack. A reflector is applied to a second principal surface of the stack, so that a portion of the radiation that is initially reflected back into the semiconductor body during the emission is again pointed toward the emission surface by means of this reflector.

In this way, in addition to the primarily emitted fraction of the produced radiation, another portion is emitted after one or more internal reflections at the reflector. Overall, the degree of emission is thus increased compared to a GaN semiconductor component pursuant to the state of the art.

In a preferred embodiment, the GaN-based semiconductor layers consist of GaN, AlN, InN, AlGaN, InGaN, InAlN, or AlInGaN. By using these materials, the central wavelength of the radiation produced can be set within a broad range of the visible spectral region down to the ultraviolet spectral region. Blue and green LEDs, UV LEDs, and corresponding laser diodes can thus be realized with this invention with particular advantage.

In an especially preferred embodiment, the reflector can be produced by a metallic contact surface. This serves both as reflector and for electrical contact with the semiconductor body. It is beneficial with this embodiment that no other devices are needed on the reflector side for contacting the semiconductor body. Al and Ag, as well as Al and Ag alloys, are particularly suitable as material for the contact surfaces.

In another advantageous embodiment, the reflector can also be made by dielectric vapor deposition. Such vapor deposition can be performed by applying a sequence of layers of $SiO_2$ or $TiO_2$ to the semiconductor body. With dielectric vapor deposition, a loss-free reflection in a broad wavelength region can advantageously be produced.

In a preferred refinement, the reflector has a transparent first layer applied to the second principal surface, and a second reflecting layer applied to this one. This permits optimizing the contact layer in a simple manner both with regard to its electrical characteristics and to its reflection characteristics.

In another preferred embodiment, the entire free surface of the semiconductor body or a subregion of it is roughened. This roughing interferes with total reflection at the emission surface and the optical degree of emission is thereby further increased.

In the production method pursuant to the invention, an interlayer is first applied to a substrate. A plurality of different III-V nitride semiconductor layers are then deposited on this interlayer. These layers constitute the semiconductor body of the component. In the next step, the substrate including the interlayer is then stripped from the stack of III-V nitride layers thus formed. In a further step, a reflector is applied to one of the two principal surfaces of the semiconductor body.

In another embodiment, an Si substrate is used, on which is applied an SiC interlayer. SiC is particularly suitable for the production of GaN-based components, since it has a lattice constant similar to that of GaN, so that layers based on GaN deposited on SiC have a small number of lattice defects.

In another especially preferred embodiment, the interlayer is applied by a wafer-bonding method and is then thinned. When using an Si substrate and an SiC interlayer, the Si wafer can advantageously be bonded to the SiC wafer by making an $SiO_2$ layer.

Alternatively, the interlayer can be grown by epitaxy, by which especially homogeneous interlayers can be produced.

In another preferred embodiment, the reflector is made by applying a reflecting metal contact to the GaN semiconductor body. Ag and Al as well as Ag and Al alloys are especially suitable as materials for the metal contact because of their reflectivity and bonding characteristics.

Another embodiment of the production method consists of making the reflector as a dielectric mirror in the form of a plurality of dielectric layers, which results in the benefits of a dielectric reflector described above.

In an especially preferred refinement of the invention, the production method is continued by roughening the semiconductor body, with the entire free surface of the semiconductor body or subregions thereof being roughened. Especially effective roughening with regard to increasing the yield of light is produced by etching the semiconductor body or by a sand-blasting method.

In another particularly preferred embodiment, a mask layer is applied to the interlayer prior to the deposition of the III-V nitride layers. This mask layer structures the layers and in particular it separates the III-V nitride layers into several discontinuous regions. This very beneficially prevents cracking and detachment of the interlayer from the substrate. An oxide mask is advantageously made as the mask, especially when using SiC as the interlayer material.

In another production method pursuant to the invention, a plurality of III-V nitride layers are applied by epitaxy to a composite substrate that has a substrate body and an interlayer, with the coefficient of thermal expansion of the substrate body being similar to or greater than the coefficient of thermal expansion of the III-V nitride layers. A composite substrate in this context means a substrate that contains at least two regions, the substrate body and the interlayer, and that as such represents the starting substrate for the epitaxial process. In particular, the interlayer is not applied to the substrate body by epitaxy, but preferably by a wafer-bonding method.

With such a composite substrate, the thermal properties are determined above all by the substrate body, while the epitaxy surface and especially its lattice constant are largely independently fixed by the interlayer. Thus the interlayer can beneficially be optimally matched to the lattice constant of the layers to be applied. At the same time, the use of a substrate body with a sufficiently high coefficient of thermal expansion prevents the development of tensile stresses in the GaN-based layers in the cooling phase after application, and the resulting formation of cracks in the layers. Therefore, the interlayer is advantageously made so thin that the coefficient of thermal expansion of the entire composite substrate corresponds essentially to the coefficient of expansion of the substrate body. The substrate body in this case is typically at least twenty times as thick as the interlayer.

In an advantageous configuration of the invention, the substrate body contains SiC, preferably polycrystalline (poly-SiC), sapphire, GaN, or AlN. The coefficient of thermal expansion of SiC is similar to the coefficient of expansion of GaN-based materials, while the other materials mentioned have larger coefficients of thermal expansion than GaN-based materials. Thus cracking of the epitaxially applied layers during cooling is advantageously avoided.

In a preferred configuration of the invention, the interlayer contains SiC, silicon, sapphire, MgO, GaN, or AlGaN. These materials are especially suitable for producing an essentially monocrystalline surface with a lattice constant matching that of GaN. An Si(111) surface or a monocrystalline SiC surface is preferably used as the epitaxy surface on which the GaN-based layers are grown.

In an advantageous refinement of the invention, the GaN-based layers are deposited on a composite substrate in which the interlayer is applied to the substrate body by a wafer-bonding method. A bonding layer, for example of silicon oxide, is produced between the substrate body and the interlayer.

A number of material systems can beneficially be combined with wafer-bonding procedures, without being limited by material incompatibilities, as for example in the case of the epitaxial application of an interlayer on a substrate body.

To obtain a sufficiently thin interlayer, a thicker interlayer can also first be bonded to the substrate body, which is then thinned to the necessary thickness, for example by grinding or splitting.

In a beneficial refinement of the invention, a mask layer is produced on the composite substrate before the deposition of the III-V nitride layers, so that the III-V nitride layers grow only on the regions of the epitaxial surface that are not covered by the mask. These layers are thereby advantageously interrupted in the plane of the layer, and additional protection against tensile stress and the associated cracking is thus achieved.

Another preferred configuration of the invention consists of structuring the III-V nitride layers into individual semiconductor layer stacks after deposition on the composite substrate. A support is then applied to the III-V nitride semiconductor layer stack and the composite substrate is detached. The composite substrate in this way can then be reused, at least in part. This represents a special advantage for SiC substrate bodies, the production of which involves very high costs. A thin-layer component can also be made in this way. A thin-layer component means a component that contains no epitaxy substrate.

In the case of radiation-emitting semiconductor components, the radiation yield is thus increased since absorption of the radiation produced in the epitaxy substrate, such as that occurring in particular with SiC substrates, is avoided.

The so-called rebonding of the semiconductor layer stack just described, from the composite substrate to a support, can also be performed in two steps with the invention, with the GaN-based semiconductor layer stack first being bonded to an intermediate support and then to the actual carrier, so that the actual carrier then takes the place of the composite substrate. Semiconductor layer stacks made in this way advantageously have a layer sequence corresponding to GaN-based semiconductor bodies with epitaxy substrate pursuant to the state of the art, so that the same subsequent processing steps can be used for both layer stacks, for example singling, contacting, and incorporation into a housing.

In the production method, a reflector layer is produced on the semiconductor layer stack to increase the radiation yield. The radiation yield in the case of GaN-base semiconductor components in large part is limited by reflection at the interfaces of the semiconductor body. In the case of radiation-emitting semiconductor bodies with no absorbing substrate, the radiation fractions reflected at the emission surfaces can advantageously be pointed back to the emission surface again by a reflector layer. This further increases the radiation yield.

The reflector layer, is preferably made as a metallic layer which contains aluminum, silver, or an appropriate aluminum or silver alloy, for example.

Such a metallic layer can be used advantageously as a contact surface at the same time. Alternatively, the reflector layer can also be made by dielectric vapor deposition in the form of a plurality of dielectric layers.

In an advantageous refinement of the invention, at least a portion of the surface of the semiconductor layer stack is roughened. This interferes with total reflection at the surface and thus the radiation yield is increased. The roughening is preferably done by etching or by a sand blasting process.

BRIEF DESCRIPTION OF THE DRAWINGS

Other features, advantages, and uses are found in the following description of four examples of embodiment, in combination with FIGS. 1 to 7. The figures show.

DETAILED DESCRIPTION OF THE INVENTION

Figure 1:
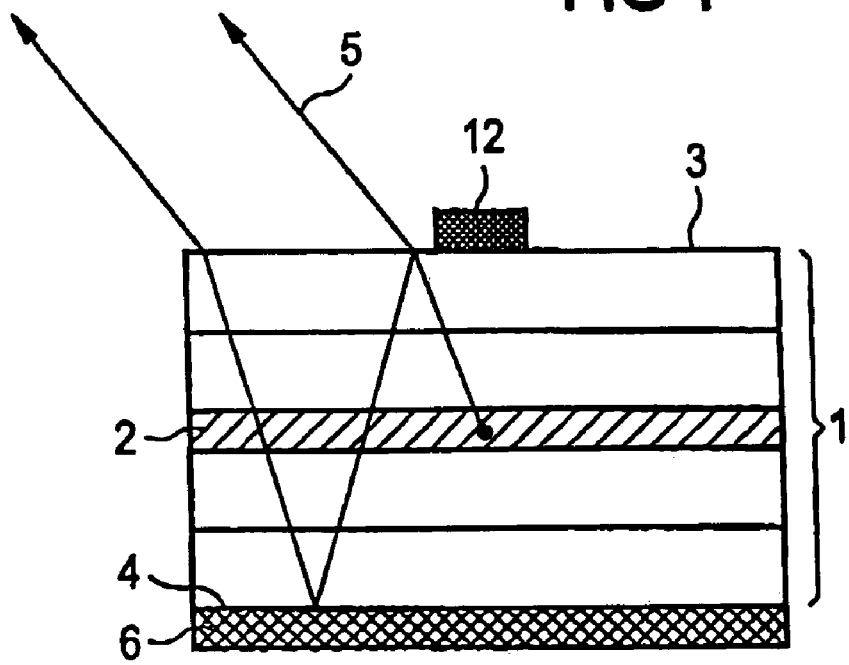
FIG. 1 a schematic cross-sectional view of a first embodiment of a semiconductor component pursuant to the invention, FIG. 2 a schematic cross-sectional view of a second embodiment of a semiconductor component pursuant to the invention, FIG. 3 a schematic illustration of a first example of embodiment of a first production method pursuant to the invention, and FIG. 4 a schematic illustration of a first example of embodiment of a second production method pursuant to the invention.

The radiation-emitting semiconductor component shown in FIG. 1 has a plurality of different semiconductor layers 1 in stacked arrangement that consist of GaN or of a ternary or quaternary compound based thereon. In operation, an active zone 2 is formed within these layers in which the radiation 5 is generated.

The stack of layers is bounded by a first principal surface 3 and a second principal surface 4. The radiation 5 produced is essentially emitted through the first principal surface 3 to the adjoining surroundings.

A reflector 6 is applied to the second principal surface 4, formed from an Ag layer vapor-deposited on the semiconductor body. Contact with the semiconductor body is made on the emission side by the contact surface 12, and on the reflector side by the Ag reflector layer. Contacting can be achieved on the reflector side, for example, by contacting the semiconductor body on the reflector side with a metal body that serves both as carrier and to infeed current.

The reflector 6 causes a portion of the radiation 5 that is reflected back into the semiconductor body at the first principal surface 3 during emission, to be reflected back toward the first principal surface 3, so that the amount of radiation emitted through the first principal surface 3 is increased overall. This increase is made possible by the fact that the component is made as a thin-layer component with no radiation-absorbing substrate, and the reflector 6 is applied directly to the GaN semiconductor body.

Figure 2:
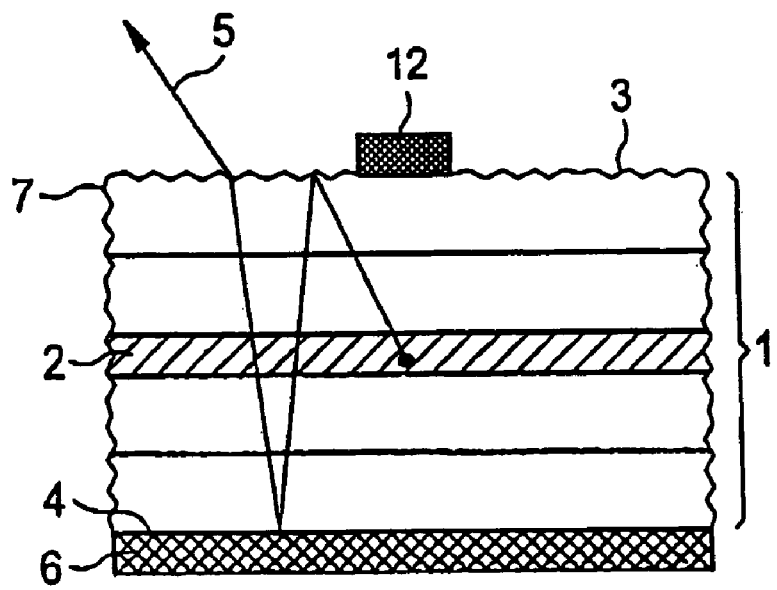
Figure 3A:
Figure 3B:
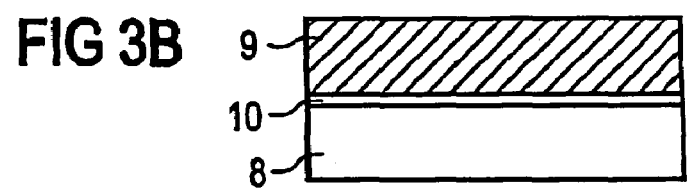
Figure 3C:
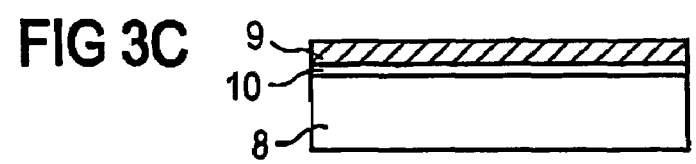
Figure 3D:
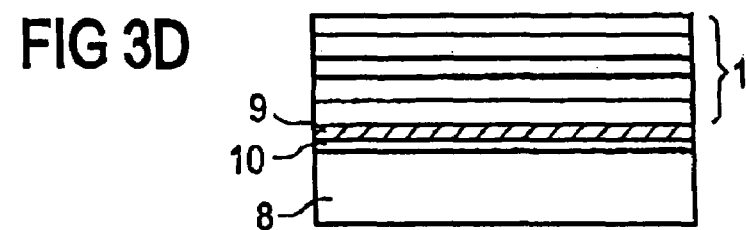
Figure 3E:
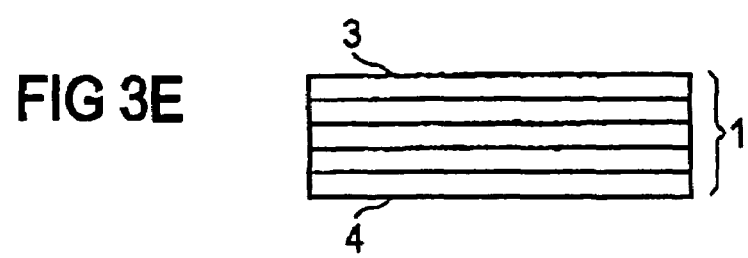
Figure 3F:
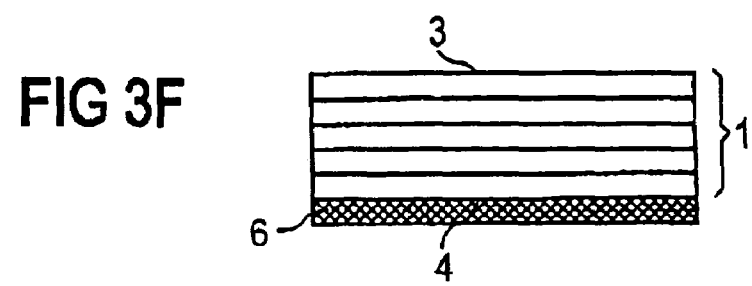

The example of embodiment of a semiconductor component pursuant to the invention shown in FIG. 2 differs from the component shown in FIG. 1 in that the surface of the semiconductor body has a roughening 7. This roughening 7 causes scattering of the radiation 5 at the first principal surface 3, so as to interfere with total reflection at the first principal surface 3. Furthermore, this scattering prevents the radiation produced by continuing reflections of the same kind from being guided between the two principal surfaces 3 and 4 and the reflector 6, in the way of an optical waveguide, without leaving the semiconductor body. Thus, the roughening 7 further increases the light yield.

FIG. 3 shows a first example of embodiment of a production method pursuant to the invention. The starting point is an Si substrate 8, FIG. 3a. In a first step, an SiC interlayer 9 is applied to this Si substrate by a wafer-bonding method, with an $SiO_2$ layer 10 being developed between the two substrates, FIG. 3b. In the next step, the SiC substrate 9 is thinned to a few micrometers, FIG. 3c. A plurality of different GaN semiconductor layers 1 are epitaxially deposited on the thinned SiC substrate 9 by an MOCVD method, which constitute the semiconductor body of the component pursuant to the invention, FIG. 3d. After producing the GaN layer stack, the Si substrate 8 and the SiC interlayer 9 are removed, FIG. 3e. A reflecting metallic contact surface 6, consisting of an Ag or Al alloy, is then vapor-deposited on a principal surface 4 of the GaN semiconductor body, FIG. 3*f*.

To minimize total reflection at the first principal surface 3, the semiconductor body can then be roughened by a sandblasting procedure or by etching with a suitable etching mixture.

Figure 4A:
Figure 4B:
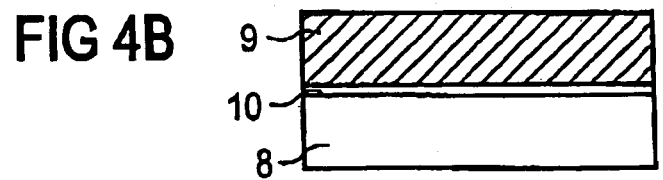
Figure 4C:
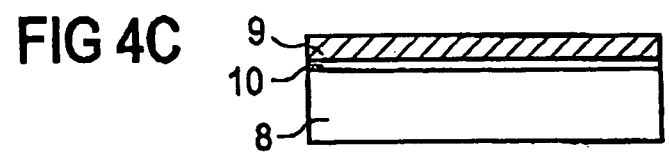
Figure 4D:
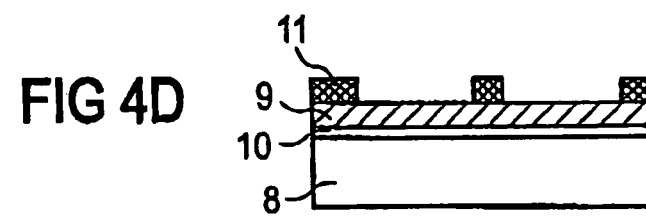
Figure 4E:
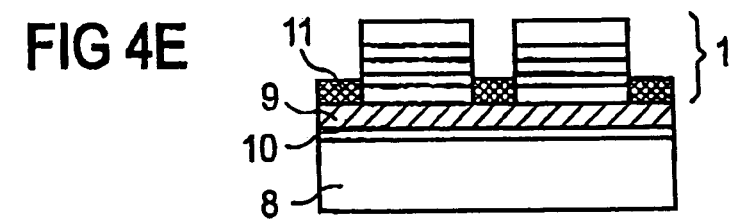
Figure 4F:
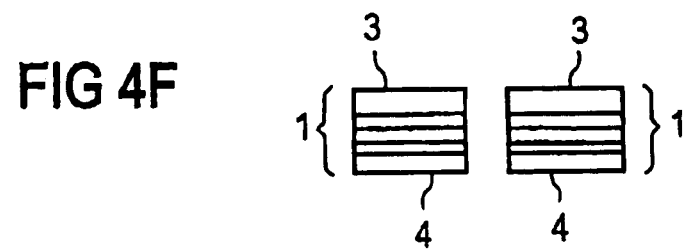

The embodiment of a production method pursuant to the invention shown in FIG. 4 is analogous to the first example of embodiment described above up to and including the thinning of the SiC substrate 9 (FIGS. 4*a* to 4*c*). In contrast to it, an oxide mask 11 is applied to the SiC layer 9 prior to the deposition of the GaN layers 1, FIG. 4*d*. This oxide mask 11 causes the GaN layers 1 to grow in the next step only on the subregions of the SiC interlayer not covered by the mask.

Figure 4G:
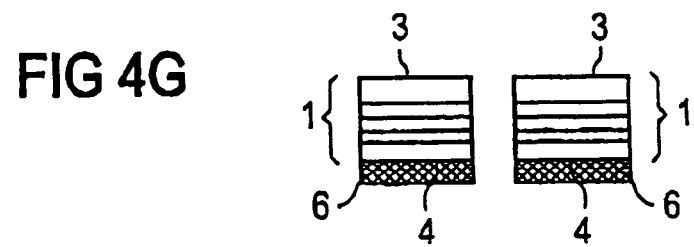

Since the GaN layers 1 formed in this way are interrupted along the plane of the layer, stresses from the differing coefficients of thermal expansion of SiC and GaN that occur especially during the cooling of the component after its production, are reduced. This leads advantageously to less cracking in the GaN layers 1 and suppresses delamination of the SiC interlayer 9 from the substrate. The reflector 6, FIG. 4*g*, is produced as described above.

Figure 5:
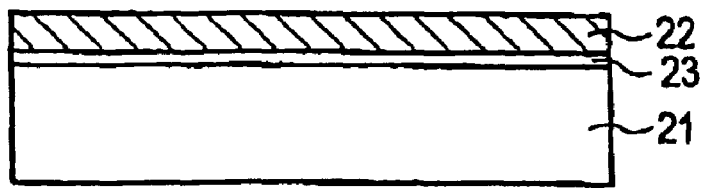
FIG. 5 a schematic cross-sectional illustration of another example of embodiment of a production method pursuant to the invention, FIG. 6 a schematic cross-sectional illustration of another example of embodiment of a production method pursuant to the invention, and FIG. 7 a schematic cross-sectional illustration of another example of embodiment of a production method pursuant to the invention.
Figure 5:
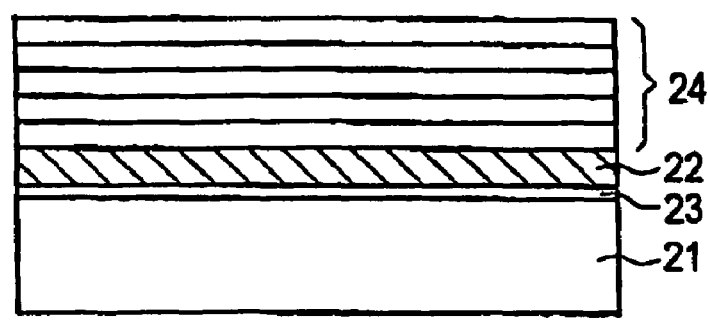
Figure 5:
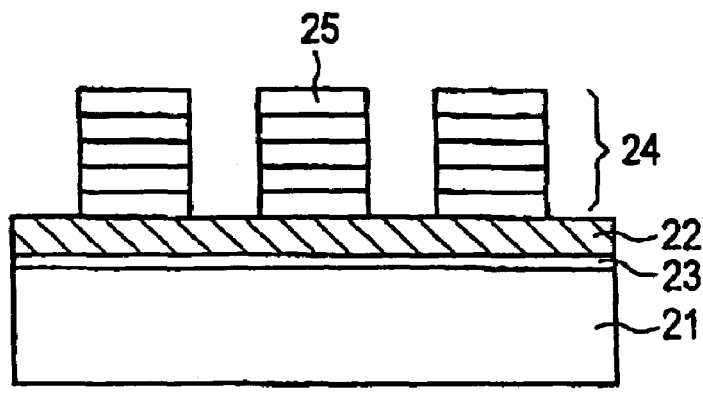
Figure 5:
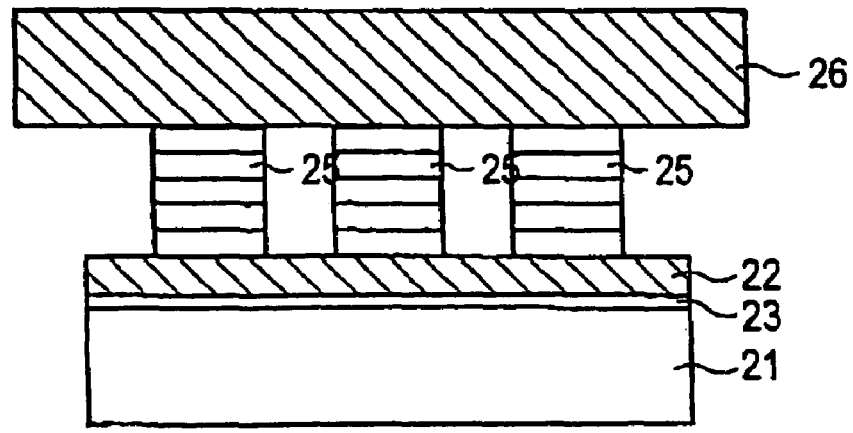
Figure 5:
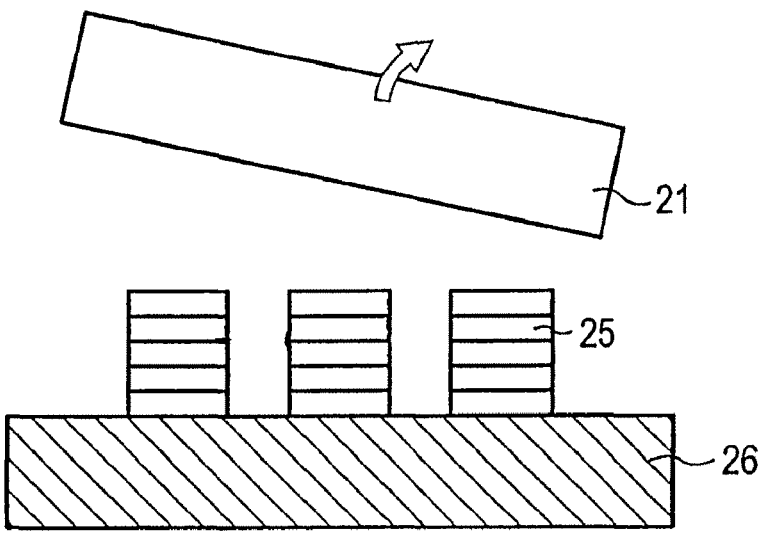
Figure 5:
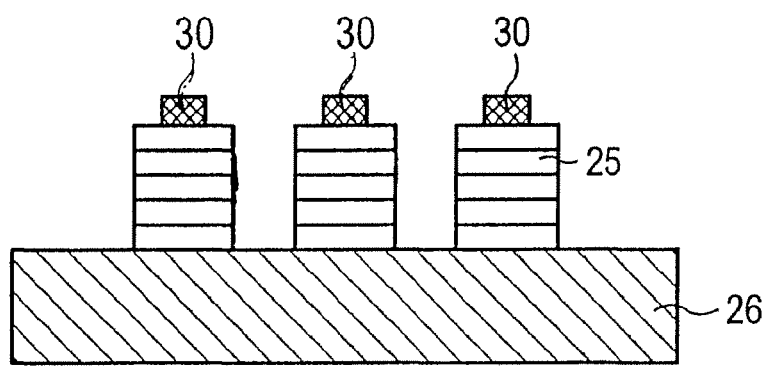
Figure 5:
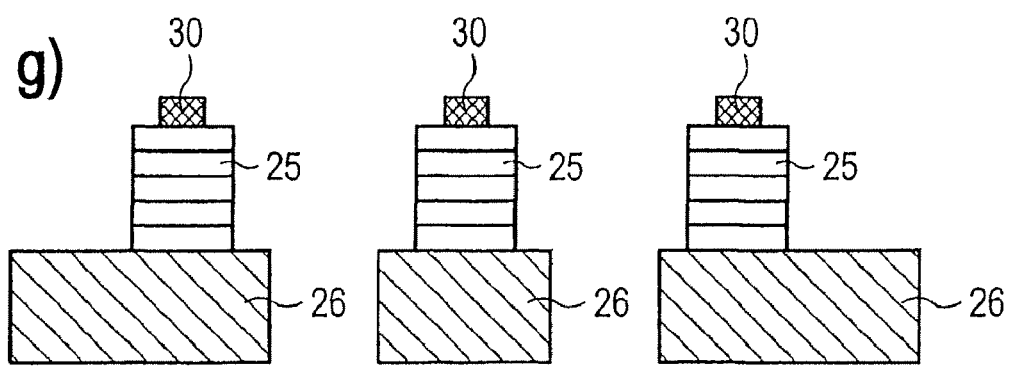

In the production method shown in FIG. 5, a composite substrate is used with a substrate body 21 of poly-SiC, to which a monocrystalline SiC interlayer 22 is bonded by a known method. To this end, a bonding layer 23, for, example of silicon oxide, is formed between the substrate body 21 and the interlayer 22, FIG. 5*a*.

A plurality of GaN-based layers 24 are grown by epitaxy on this composite substrate, FIG. 5*b*. The structure of the sequence of layers is subject to no restrictions in principle.

Preferably an active layer is formed to produce radiation, which is surrounded by one or more mantle layers and/or waveguide layers. The active layer can be made up of a number of thin individual layers in the form of a mono quantum well or multiple quantum well structure.

It is also advantageous first to produce a buffer layer, for example based on AlGaN, on the interlayer 22, by which an improved lattice match and higher wettability with regard to the following layers can be achieved. To increase the electrical conductivity of such a buffer layer, electrically conductive channels can be enclosed in the buffer layer, for example based on InGaN.

The GaN-based layers 24 are then divided into individual semiconductor layer stacks 25 by lateral structuring, preferably by mesa etching, FIG. 5*c*.

In the next step, FIG. 5*d*, a carrier 26, for example of GaAs or a material transparent to the radiation produced, is applied to these semiconductor layer stacks 25.

The composite substrate including the interlayer 22 is thereupon detached from the semiconductor layer stacks 25, FIG. 5*e*. This can be done, for example, by an etching process in which the interlayer 22 or the bonding layer 23 is destroyed. The substrate body 21 can advantageously be reused in another production cycle.

Contact surfaces 30 are then applied to the thin-layer semiconductor body 25 thus formed, FIG. 5*f*. The semiconductor layer stack 25 is then singled, FIG. 5*g*, and further processed in the usual way.

Figure 6:
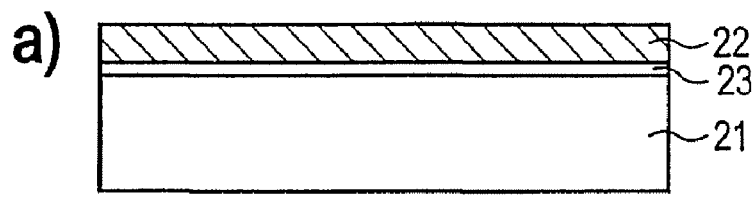
Figure 6:
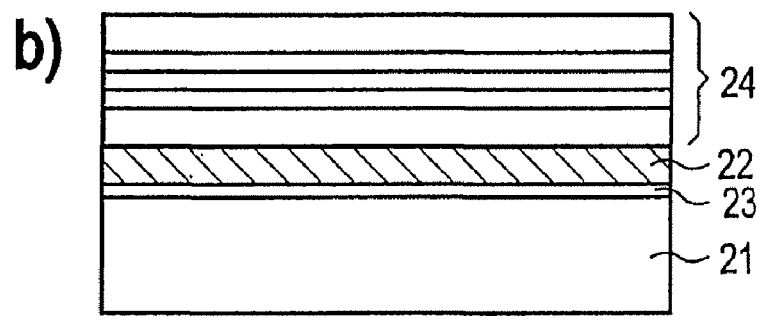
Figure 6:
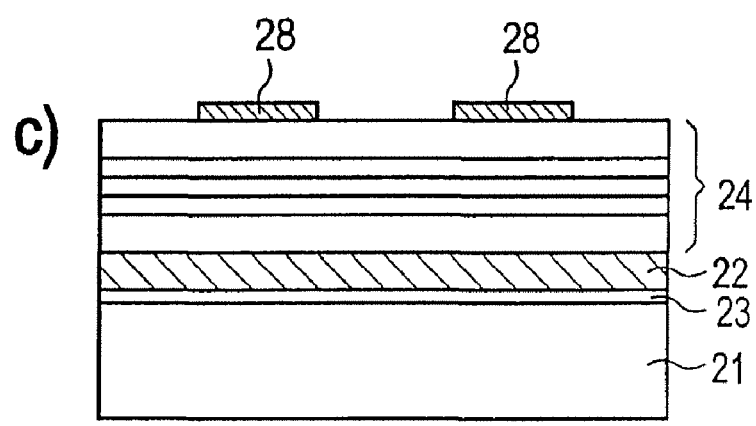
Figure 6:
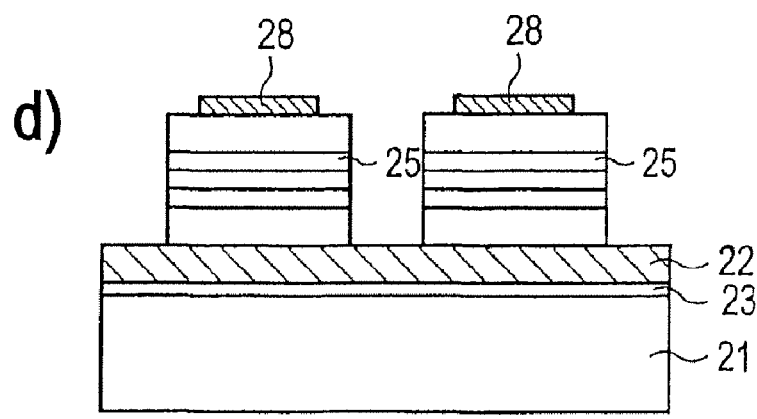

In the production method illustrated in FIG. 6, a composite substrate is again used, which is essentially made up of a poly-SiC substrate body 21 and an Si(111) interlayer 22. The interlayer 22 is applied to the substrate body 21 using a wafer-bonding method, with the production of a silicon oxide bonding layer 23, FIG. 6*a*.

A plurality of GaN-based layers are then grown in turn on this composite substrate, FIG. 6*b*, which is then provided with a contact layer 28, for example made of platinum, FIG. 6*c*.

The GaN-based layers 24 are then divided into individual semiconductor layer stacks 25 by etch structuring, FIG. 6*d*.

For protection, a passivating layer 31, preferably based on silicon nitride, is then applied to these semiconductor layer stacks 25 formed in this way, FIG. 6*e*.

Bonding solder 32 is then deposited on each region of the contact layer 28 not covered by the passivating layer, and on it is deposited a reflector 29 of a silver or aluminum alloy, FIG. 6*f*.

The semiconductor layer stacks 25 with the reflector 29 are then rebonded eutectically to a carrier 26, FIG. 6*g*.

In the following step, FIG. 6*h*, the substrate body 21 is removed and can thus be reused.

The individual semiconductor layer stacks are then provided with contact surfaces 30 on their tops, FIG. 6*i*. The semiconductor layer stacks can then by singled and optionally incorporated into a housing (not shown).

Figure 7:
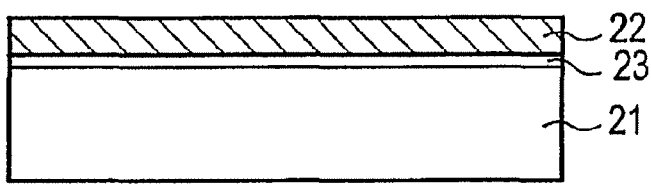
Figure 7:
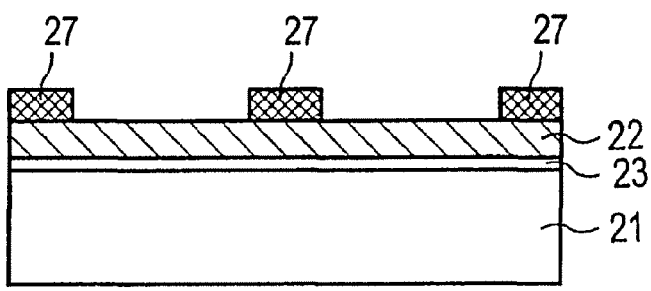
Figure 7:
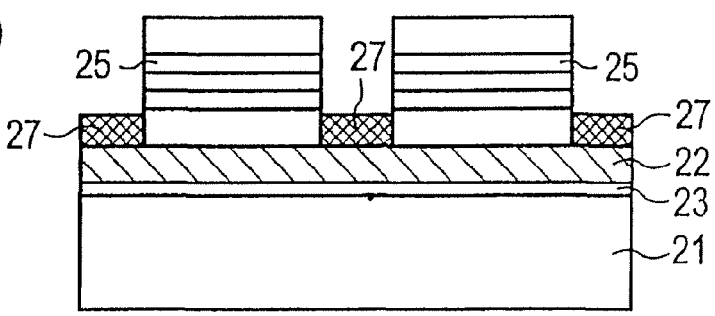

The example of embodiment of a production method pursuant to the invention shown in FIG. 7 represents a variant of the previous examples of embodiment.

Again, as already described, a composite substrate is used as the epitaxy substrate, FIG. 7*a*.

Before depositing the GaN-based layer 24, a mask layer 27 is applied to the epitaxy surface of the interlayer 22, FIG. 7*b*. The GaN-based layers 24 thus grow only on the regions of the epitaxy surface that are not covered by the mask layer 27 (epitaxy windows), FIG. 7*c*. The GaN-based layers 24 are thereby interrupted in the layer plane. This additionally avoids tensile stresses in the epitaxially deposited layers in the cooling phase.

The production method can then be continued as in the other examples of embodiment.

The explanation of the invention with reference to the described examples of embodiment naturally does not imply any limitation of the invention thereto, but it comprises all forms of embodiment that make use of the inventive concept.

What is claimed is:

1. Method for producing a radiation-emitting semiconductor component whose semiconductor body includes a stack of different III-V nitride semiconductor layers configured to emit radiation, wherein the semiconductor body has a first principal surface and a second principal surface, with at least a portion of the radiation being emitted through the first principal surface, the method comprising:

producing a reflecting contact layer for electrically contacting said semiconductor body on the second principal surface of the semiconductor body on the semiconductor layer stack, wherein producing the contact layer comprises applying a first layer to the semiconductor layer stack and applying a second layer to the first layer, wherein the first layer is transparent to the radiation emitted by the stack of different III-V nitride semiconductor layers and the second layer reflects the radiation emitted by the stack of different III-V nitride semiconductor layers, wherein the different III-V nitride semiconductor layers are epitaxially grown on a substrate, wherein the transparent first layer is not epitaxially grown on the substrate, wherein the substrate is a composite substrate that has a substrate body and an interlayer, with a coefficient of thermal expansion of the substrate body being similar to or greater than a coefficient of thermal expansion of the III-V nitride layers, with the III-V nitride layers being deposited on the interlayer, and
wherein the substrate is removed.

2. Method pursuant to claim 1, wherein an Si substrate is used as the substrate.

3. Method pursuant to claim 2, wherein an SiC interlayer is applied.

4. Method pursuant to claim 1, wherein the interlayer is applied by a wafer-bonding method.

5. Method pursuant to claim 1, wherein the interlayer is applied by epitaxy.

6. Method pursuant to claim 1, wherein the reflecting contact layer is made by applying a layer of metal, wherein the method further comprises using the applied layer of metal to provide an electrical contact to the semiconductor body.

7. Method pursuant to claim 1, further comprising applying a mask to the interlayer before producing the stack.

8. Method pursuant to claim 1, wherein the thickness of the interlayer is so small that the coefficient of thermal expansion of the composite substrate is determined essentially by the substrate body.

9. Method pursuant to claim 1, wherein the substrate body comprises SiC, poly-SiC, sapphire, GaN, or AlN.

10. Method pursuant to claim 1, wherein the interlayer comprises SiC, silicon, sapphire, MgO, GaN, or AlGaN.

11. Method pursuant to claim 1, wherein the interlayer has a monocrystalline surface at least in subregions.

12. Method pursuant to claim 1, wherein the III-V nitride layers are deposited on an Si(111) surface or on an SiC surface of the interlayer that is monocrystalline at least in subregions.

13. Method pursuant to claim 1, wherein the interlayer is applied to the substrate body by a wafer-bonding method.

14. Method pursuant to claim 1, wherein a bonding layer is produced between the substrate body and the interlayer.

15. Method pursuant to claim 14, wherein the bonding layer contains silicon oxide.

16. Method pursuant to claim 1, wherein a mask layer is produced with epitaxy windows on the composite substrate before applying the III-V nitride layers, with the epitaxy surface of the composite substrate remaining uncovered within the epitaxy windows.

17. Method pursuant claim 1, wherein the III-V nitride layers are structured into individual semiconductor layer stacks after being applied to the composite substrate.

18. Method pursuant to claim 17, wherein the method further comprises:
application of a carrier to the semiconductor layer stack,
detachment of the composite substrate.

19. Method pursuant to claim 17, wherein the method further comprises:
application of an interlayer on the semiconductor layer stack,
detachment of the composite substrate,
application of a carrier to the side of the semiconductor layer stack from which the composite substrate has been detached,
detachment of the interlayer.

20. Method pursuant to claim 17, wherein the reflecting contact layer is produced by applying a metallic layer.

21. Method pursuant to claim 17, wherein the metallic layer comprises silver, aluminum or a silver or aluminum alloy.

22. Method pursuant to claim 17, further comprising using the reflecting contact layer serves as a contact surface for an electrical connection to the semiconductor layer stack.

23. Method pursuant to claim 6 wherein said metal layer comprises both the transparent first layer and the reflecting second layer.

24. Method for producing a radiation-emitting semiconductor component whose semiconductor body includes a stack of different III-V nitride semiconductor layers configured to emit radiation, wherein the semiconductor body has a first principal surface and a second principal surface, with at least a portion of the radiation being emitted through the first principal surface, the method comprising:
applying the III-V nitride layers to a composite substrate that has a substrate body and an interlayer, with the coefficient of thermal expansion of the substrate body being similar to or greater than the coefficient of thermal expansion of the III-V nitride layers, with the III-V nitride layers being deposited on the interlayer, wherein the III-V nitride layers are deposited on an Si(111) surface or on an SiC surface of the interlayer that is monocrystalline at least in subregions; and
producing a reflector on the second principal surface of the semiconductor body on the semiconductor layer stack, wherein producing the reflector comprises applying a first layer to the semiconductor layer stack and applying a reflecting second layer to the first layer, wherein the first layer is transparent to the radiation emitted by the stack of different III-V nitride semiconductor layers.

25. Method for producing a radiation-emitting semiconductor component whose semiconductor body includes a stack of different III-V nitride semiconductor layers configured to emit radiation, wherein the semiconductor body has a first principal surface and a second principal surface, with at least a portion of the radiation being emitted through the first principal surface, the method comprising:
applying the III-V nitride layers to a composite substrate that has a substrate body and an interlayer, with the coefficient of thermal expansion of the substrate body being similar to or greater than the coefficient of thermal expansion of the III-V nitride layers, with the III-V nitride layers being deposited on the interlayer, wherein the interlayer is applied to the substrate body by a wafer-bonding method; and
producing a reflector on the second principal surface of the semiconductor body on the semiconductor layer stack, wherein producing the reflector comprises applying a first layer to the semiconductor layer stack and applying a reflecting second layer to the first layer, wherein the first layer is transparent to the radiation emitted by the stack of different III-V nitride semiconductor layers.

26. Method for producing a radiation-emitting semiconductor component whose semiconductor body includes a stack of different III-V nitride semiconductor layers configured to emit radiation, wherein the semiconductor body has a first principal surface and a second principal surface, with at least a portion of the radiation being emitted through the first principal surface, the method comprising:
applying the III-V nitride layers to a composite substrate that has a substrate body and an interlayer, with the coefficient of thermal expansion of the substrate body being similar to or greater than the coefficient of thermal expansion of the III-V nitride layers, with the III-V nitride layers being deposited on the interlayer, wherein the III-V nitride layers are structured into individual semiconductor layer stacks after being applied to the composite substrate; and
producing a reflector on the second principal surface of the semiconductor body on the semiconductor layer stack, wherein producing the reflector comprises applying a first layer to the semiconductor layer stack and applying a reflecting second layer to the first layer, wherein the first layer is transparent to the radiation emitted by the stack of different III-V nitride semiconductor layers;

wherein applying the III-V nitride layers to the composite substrate comprises:
applying the interlayer on the semiconductor layer stack,
detaching the composite substrate,
applying a carrier to the side of the semiconductor layer stack from which the composite substrate has been detached, and
detaching the interlayer.

27. Method for producing a radiation-emitting semiconductor component whose semiconductor body includes a stack of different III-V nitride semiconductor layers configured to emit radiation, wherein the semiconductor body has a first principal surface and a second principal surface, with at least a portion of the radiation being emitted through the first principal surface, the method comprising:
producing a reflecting contact layer for electrically contacting said semiconductor body on the second principal surface of the semiconductor body on the semiconductor layer stack,
wherein producing the contact layer comprises applying a first layer to the semiconductor layer stack and applying a second layer to the first layer,
wherein the first layer is transparent to the radiation emitted by the stack of different III-V nitride semiconductor layers and the second layer reflects the radiation emitted by the stack of different III-V nitride semiconductor layers,
wherein the different III-V nitride semiconductor layers are epitaxially grown on a substrate,
wherein the transparent first layer is not epitaxially grown on the substrate,
wherein the substrate is a composite substrate that has a substrate body and an interlayer, with a coefficient of thermal expansion of the substrate body being similar to or greater than a coefficient of thermal expansion of the III-V nitride layers, with the III-V nitride layers being deposited on the interlayer, and
wherein the interlayer is applied to the substrate body by a wafer-bonding method.

28. Method for producing a radiation-emitting semiconductor component whose semiconductor body includes a stack of different III-V nitride semiconductor layers configured to emit radiation, wherein the semiconductor body has a first principal surface and a second principal surface, with at least a portion of the radiation being emitted through the first principal surface, the method comprising:
producing a reflecting contact layer for electrically contacting said semiconductor body on the second principal surface of the semiconductor body on the semiconductor layer stack,
wherein producing the contact layer comprises applying a first layer to the semiconductor layer stack and applying a second layer to the first layer,
wherein the first layer is transparent to the radiation emitted by the stack of different III-V nitride semiconductor layers and the second layer reflects the radiation emitted by the stack of different III-V nitride semiconductor layers,
wherein the different III-V nitride semiconductor layers are epitaxially grown on a substrate,
wherein the transparent first layer is not epitaxially grown on the substrate,
wherein the substrate is a composite substrate that has a substrate body and an interlayer, with a coefficient of thermal expansion of the substrate body being similar to or greater than a coefficient of thermal expansion of the III-V nitride layers, with the III-V nitride layers being deposited on the interlayer and structured into individual semiconductor layer stacks after being deposited, and
wherein the method further comprises applying a carrier to the semiconductor layer stack, and detachment of the composite substrate.

29. Method for producing a radiation-emitting semiconductor component whose semiconductor body includes a stack of different III-V nitride semiconductor layers configured to emit radiation, wherein the semiconductor body has a first principal surface and a second principal surface, with at least a portion of the radiation being emitted through the first principal surface, the method comprising:
producing a reflecting contact layer for electrically contacting said semiconductor body on the second principal surface of the semiconductor body on the semiconductor layer stack,
wherein producing the contact layer comprises applying a first layer to the semiconductor layer stack and applying a second layer to the first layer,
wherein the first layer is transparent to the radiation emitted by the stack of different III-V nitride semiconductor layers and the second layer reflects the radiation emitted by the stack of different III-V nitride semiconductor layers,
wherein the different III-V nitride semiconductor layers are epitaxially grown on a substrate,
wherein the transparent first layer is not epitaxially grown on the substrate,
wherein the substrate is a composite substrate that has a substrate body and an interlayer, with a coefficient of thermal expansion of the substrate body being similar to or greater than a coefficient of thermal expansion of the III-V nitride layers, with the III-V nitride layers being deposited on the interlayer and structured into individual semiconductor layer stacks after being deposited, and
wherein the method further comprises:
application of an interlayer on the semiconductor layer stack,
detachment of the composite substrate,
application of a carrier to the side of the semiconductor layer stack from which the composite substrate has been detached; and
detachment of the interlayer.

* * * * *

UNITED STATES PATENT AND TRADEMARK OFFICE
CERTIFICATE OF CORRECTION

PATENT NO. : 7,691,659 B2
APPLICATION NO. : 11/067349
DATED : April 6, 2010
INVENTOR(S) : Stefan Bader et al.

It is certified that error appears in the above-identified patent and that said Letters Patent is hereby corrected as shown below:

Cover Page
Second Column, Other Publications, Mensz reference, third line, please delete "Extarction", *Electronics Leters*" and insert --Extraction", *Electronics Letters*--

Column 9
Line 62, Claim 21, please delete "claim 17," and insert --claim 20,--

Signed and Sealed this

Twenty-second Day of June, 2010

David J. Kappos
*Director of the United States Patent and Trademark Office*